United States Patent [19]
Chu et al.

[11] 4,415,991
[45] Nov. 15, 1983

[54] MULTIPLEXED MOS MULTIACCESS MEMORY SYSTEM

[75] Inventors: Wesley W. Chu, Pacific Palisades; David G. Hibbits, Culver City, both of Calif.

[73] Assignee: The United States of America as represented by the Secretary of the Navy, Washington, D.C.

[21] Appl. No.: 276,439

[22] Filed: Jun. 22, 1981

[51] Int. Cl.³ .............................................. G11C 13/00
[52] U.S. Cl. ........................................ 365/77; 365/73
[58] Field of Search .............................. 365/73, 76, 77

[56] References Cited
U.S. PATENT DOCUMENTS 3,520,000 7/1970 Spruth ................................... 365/77

Primary Examiner—Terrell W. Fears
Attorney, Agent, or Firm—Robert F. Beers; Thomas M. Phillips

[57] ABSTRACT

Multiaccess memory modules are each connected by means of a bus to a system address multiplexer and to a system data multiplexer/demultiplexer. Each module includes a multiaccess memory connected to the system address multiplexer through a component address demultiplexer and a single bus for being addressed. Each multiaccess memory is also connected to the system data multiplexer/demultiplexer through a component data multiplexer/demultiplexer and a single bus for reading or sensing the memory and writing data into the memory. The memory cells of the multiaccess memory components consist of capacitor storage cells, also known as metal oxide silicon (semiconductor) (MOS) capacitors.

2 Claims, 4 Drawing Figures

MULTIPLEXED MOS MULTIACCESS MEMORY SYSTEM

BACKGROUND OF THE INVENTION

The present invention relates to data processing apparatus and, more in particular, to memory apparatus for increasing the data processing rate.

Data processing rates continually increase due to advances made at both logic and the architectural levels of the processing system. Whether considering main memory or cache storage, these advances create an ever increasing demand for higher memory throughput, in other words, memory bandwidths. To satisfy this demand, storage space, for example, has been divided into independent, interleaved modules so that in one memory cycle, the memory system has the potential to service as many requests (i.e., addresses) as there are modules.

Memory components are a key substream in computer systems and represent a major hardware cost of the system. Large scale integration may be used to reduce memory component cost. However, two of the major concerns in designing efficient large scale integration memory systems are power consumption and input/output pin limitations. For a more detailed discussion of multiaccess memory, reference may be made to U.S. Pat. No. 4,104,719.

SUMMARY OF THE INVENTION

The present invention provides means for overcoming the problems of power consumption and input/ouput pin limitations in the effort to provide efficient large scale integration memory systems. Means are provided for accepting multiple addresses simultaneously to read from or write data into one or more multiaccess memory modules. Each module has demultiplexing means for allowing a single bus to feed all address registers of the multiaccess memory.

Accordingly, an object of the invention is to provide for a multiplexed, multiaccess memory system that is more efficient in power consumption and reduces the input/output pin requirements of presently known multiaccess memory systems.

Another object of the invention is the provision of a multiplexed multiaccess memory system wherein the multiaccess memory components consists of multiaccess memory cells, memory address registers, data registers, component address demultiplexer and component data multiplexer/demultiplexers.

A further object of the invention is the provision of a multiplexed multiaccess memory system wherein physical size and power consumption are reduced by utilizing capacitor storage cells, metal oxide semiconductor capacitors as the memory cells of the multiaccess memory element.

Still another object of the invention is the provision of a multiaccess memory system consisting of multiple memory access modules accessed by a system address multiplexer and a system data multiplexer/demultiplexer.

A further object is to provide a multiaccess memory system wherein the component address demultiplexer in the multiaccess memory module demultiplexes the input address according to timing signals and to their designated memory address registers, thereby reducing input pins to the multiaccess memory.

Still another object is to provide a multiaccess memory system wherein the component data multiplexer/demultiplexer in the multiaccess memory module multiplexes the output data from the memory cells according to the timing signals to one or more data buses and demultiplexes the input data into their designated data registers for storing data into their memory cells, respectively, to reduce output and input pins to the multiaccess memory module.

Other objects, advantages and novel features of the invention will become apparent from the following detailed description of the invention when considered in conjunction with the accompanying drawings.

DETAILED DESCRIPTION OF THE DRAWING

Before describing the present invention, it should be noted for purposes of simplicity, that the drawings do not attempt to illustrate the entire architectural complex either of a complete memory or of the many storage cells used in each memory module.

Figure 1:
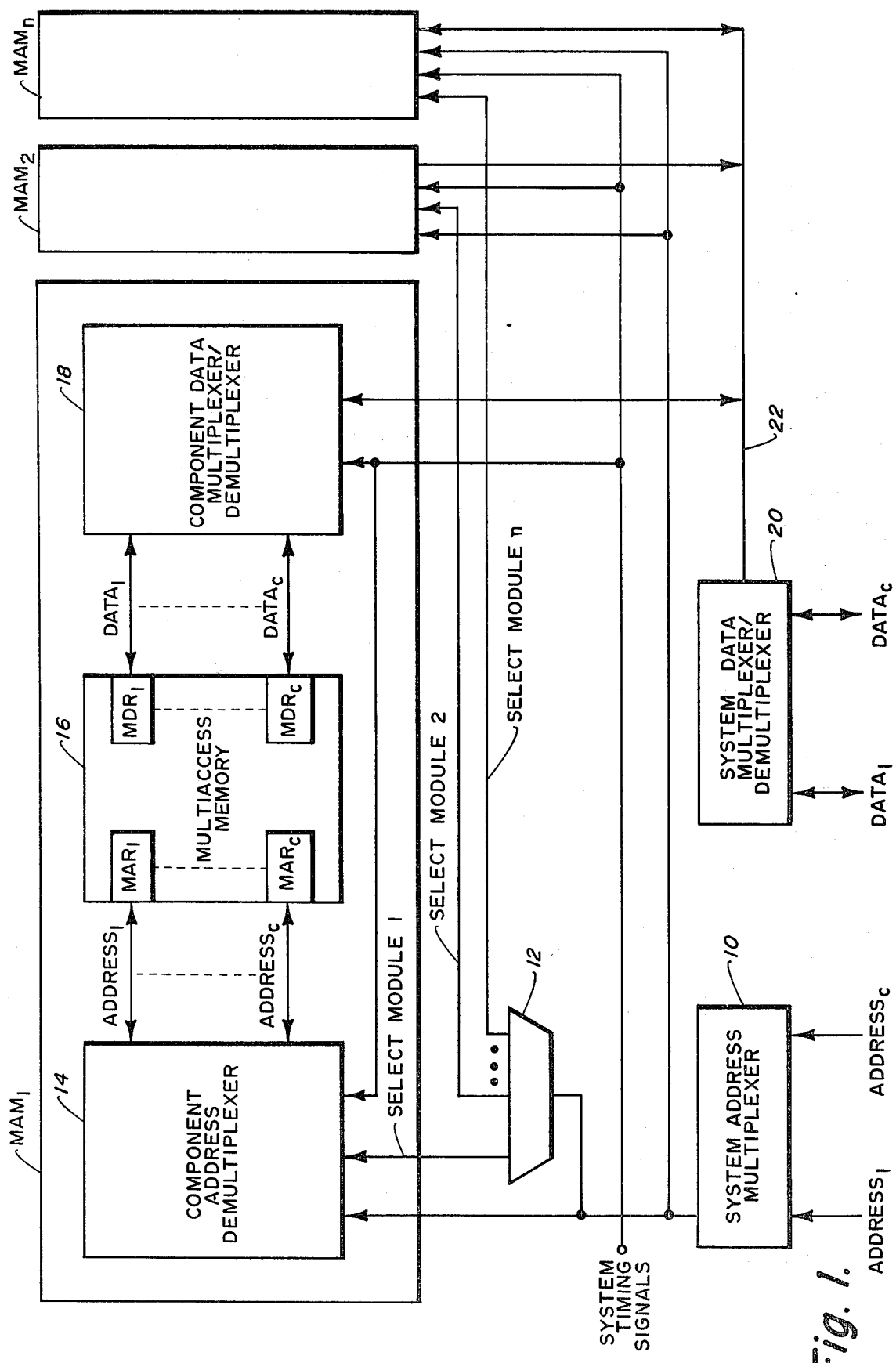
FIG. 1 is a block diagram of a multiaccess memory system embodying the invention.

Referring now to FIG. 1 where there is shown the overall multiplexed multiaccess memory system. The system comprises a system address multiplexer 10 for feeding addresses to a plurality of multiaccess memory modules $MAM_1-MAM_N$. The module address information is fed to decoder 12 which selects the specified module. One of the select module lines from decoder 12 will be set to the "true" state.

Each memory module includes a component address demultiplexer 14, multiaccess memory 16 and a component data multiplexer/demultiplexer 18. Timing signals are provided from a clock source, not shown.

When one or more addresses, received from one or more processing units, not shown, are received at the system address multiplexer 10, the received addresses are multiplexed onto a single bus that simultaneously feeds a plurality of multiaccess memory modules $MAM_1-MAM_N$. Part of the multiplexed addresses are also fed to decoder 12 which enables that particular module specified by the module address.

Figure 2:
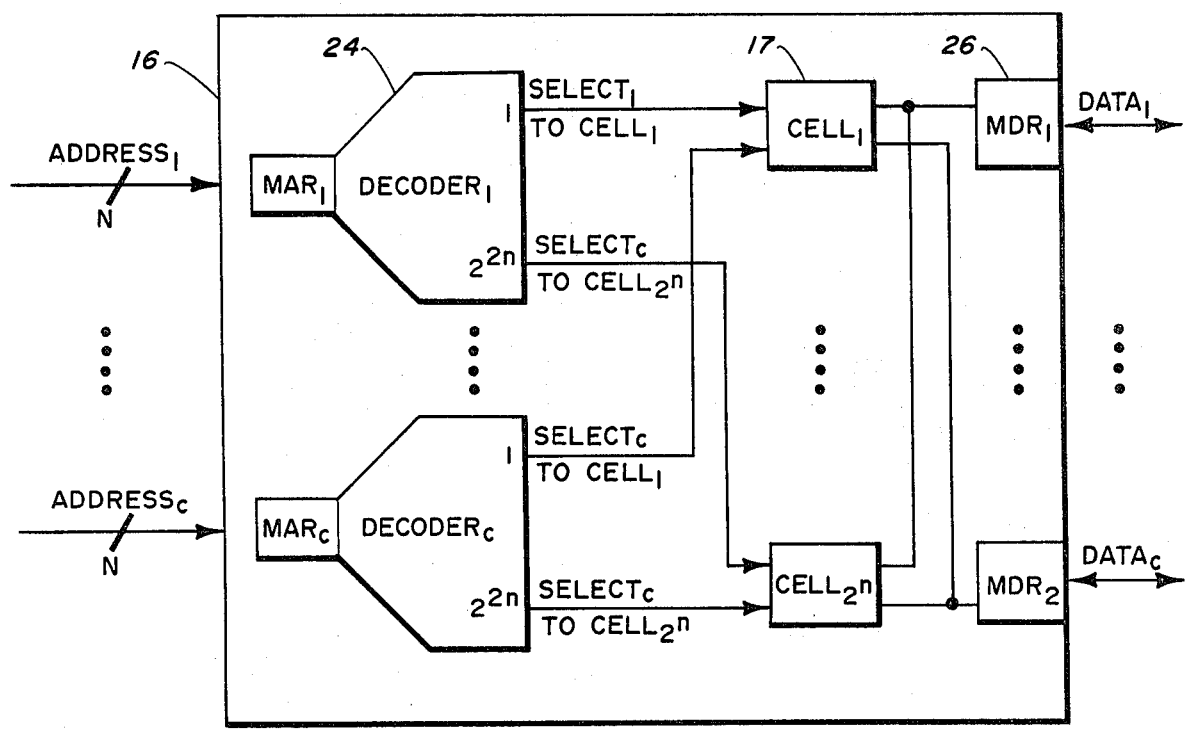
FIG. 2 is a schematic diagram illustrating a multiaccess memory.

The selected MAM will accept the address and it will be fed to the component address demultiplexer 14 which routes the address to the appropriate memory address register (MAR). The appropriate MAR decodes the address into a single select signal which selects the designated memory cell. Then the content of the memory cell is read out. As shown in FIG. 2, the address coming from address demultiplexer 14, by way of example, is directed to $MAR_1$. Decoder 24 decodes the (MAR) address to select the specified memory cell 17. For the reading process, the content of the selected memory cell will be stored in the memory data registers MDR 26 corresponding to its MAR that made the selection. For the writing process, the content of the MDR 26 is stored in the memory cell 17 specified by the corresponding MAR.

Figure 3:
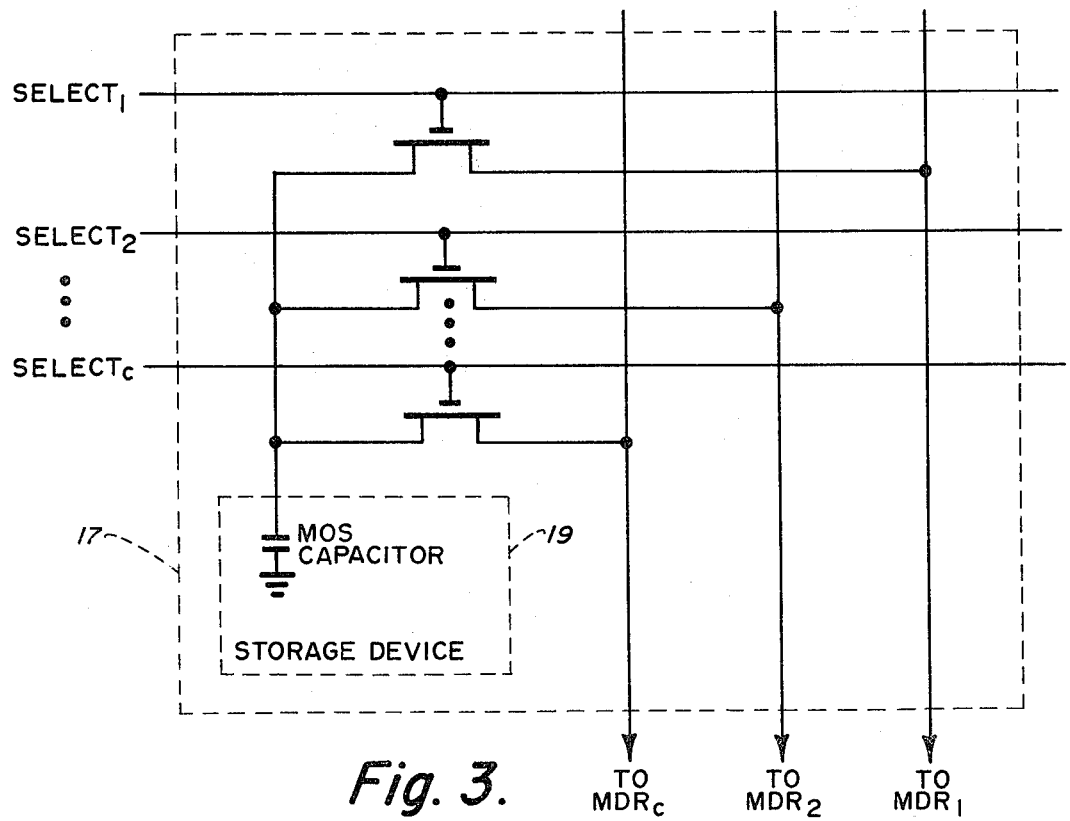
FIG. 3 is a schematic diagram illustrating a single multiaccess storage cell of the module.

Multiaccess memory cell 17 is shown in FIG. 3 and is similar to the multiaccess memory described in detail in the above referenced patent. A capacitor storage cell 19 is used as the memory storage instead of the flip-flop arrangement described in the patent.

In reading the data from memory 16, data from the MDR's are fed into component data multiplexer/demultiplexer 18. This output data is multiplexed to a data bus channel which is fed to the system data multiplexer/demultiplexer 20. Multiplexer/demultiplexer 20 demultiplexes the received data into multiple data outputs according to time sequence as shown in FIG. 4.

In writing data into memory 16, multiple data inputs are received from one or more processing units (not shown) as inputs to multiplexer/demultiplexer 20 and fed in a multiplexed data channel 22 to component data multiplexer/demultiplexer 18. If the same memory module remains selected, the data are demultiplexed into multiple data outputs and fed to MDR's in memory 16. If a different module is selected, then the demultiplying will occur in the selected module.

Figure 4:
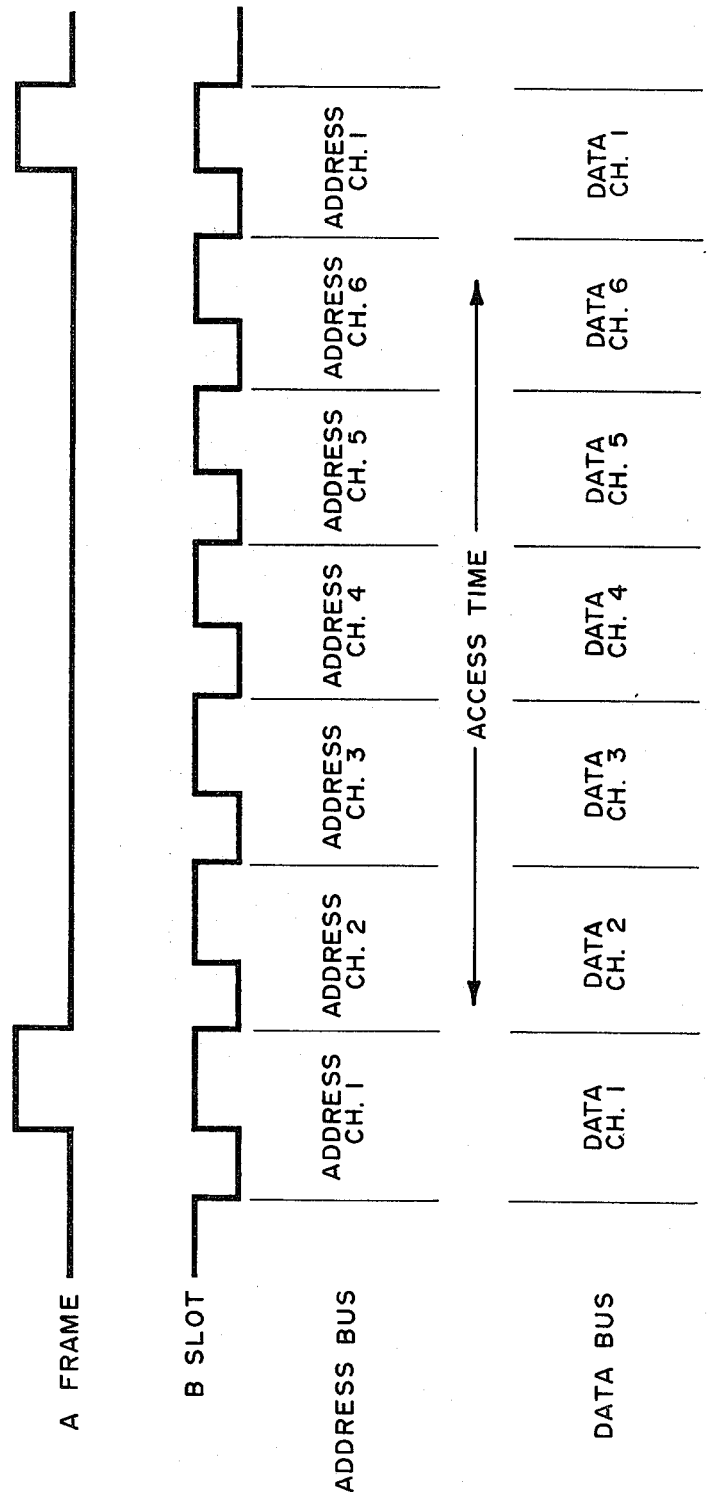
FIG. 4 is a timing diagram showing the read/write data transferred from and to the memory modules.

Referring now to FIG. 4, there is shown by way of example, a six channel multiaccess memory timing diagram. The leading edge of waveform A (frame) indicates when address and data buses are allocated to channel one. Waveform B (slots) allocates the buses to channels 1-6 in time succession. The negative transition of waveform B indicates that the busses are allocated to a new channel in sequence.

Commercially available components may be utilized in implementing the invention. Component address demultiplexer 14 may be one or more 74154 demultiplexers, depending upon the number of simultaneous memory operation desired to support. Component data multiplexer/demultiplexer 18 and system multiplexer/demultiplexer 20 may be 74253 multiplexers and 74159 demultiplexers, respectively. The system demultiplexer 10 may be implemented with 74153 multiplexer while decoder 12 may be implemented using 74154 demultiplexers. Control for each multiplexer and demultiplexer may be implemented with a 74193 counter which would be driven by the system timing signals.

Obviously many modifications and variations of the present invention are possible in the light of the above teachings. It is therefore to be understood that within the scope of the appended claims the invention may be practiced otherwise than as specifically described.

We claim:

1. Multiplexed, multiaccess memory system for use with a digital data computer system of a type having a memory formed of a plurality of memory modules each containing data bit storage cells, the computer system further including a digital data processer providing address instructions to memory address multiplexers, the outputs of which are applied to decoders functioning responsively to said instructions to activate particular storage cells of a particular module and permit the logic state of said particular cell to be altered to reflect an instruction, the memory system comprising:

a system address multiplexer having a plurality of inputs for receiving multiple addresses simultaneously from one or more processing units and having one or more addressing outputs a component address demultiplexer having an input coupled to said system address multiplexer and having a plurality of outputs, a multiaccess memory having a plurality of memory address registers, each being connected to one of said plurality of outputs of said component address demultiplexer and having a plurality of memory data registers, a system data multiplexer/demultiplexer having a plurality of terminals for receiving and transmitting data from and to said multiaccess memory according to corresponding specified addresses, and a component data multiplexer/demultiplexer coupled to said data registers and operating as a multiplexer when reading data from said memory data registers and operating as a demultiplexer when writing data into said memory data registers.

2. The system of claim 1 wherein the storage means of each memory module is an MOS storage capacitor.

* * * * *